(12) United States Patent
Gangi et al.

(10) Patent No.: US 11,837,637 B2
(45) Date of Patent: Dec. 5, 2023

(54) SEMICONDUCTOR DEVICE HAVING MULTIPLE CONDUCTIVE MEMBERS

(71) Applicant: KABUSHIKI KAISHA TOSHIBA, Tokyo (JP)

(72) Inventors: Hiro Gangi, Ota Tokyo (JP); Tomoaki Inokuchi, Yokohama Kanagawa (JP); Yusuke Kobayashi, Nagareyama Chiba (JP); Hiroki Nemoto, Fuchu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/399,318

(22) Filed: Aug. 11, 2021

(65) Prior Publication Data
US 2022/0231135 A1   Jul. 21, 2022

(30) Foreign Application Priority Data
Jan. 20, 2021   (JP) .................................. 2021-006875

(51) Int. Cl.
*H01L 29/40*   (2006.01)
*H01L 29/78*   (2006.01)

(52) U.S. Cl.
CPC .......... *H01L 29/404* (2013.01); *H01L 29/407* (2013.01); *H01L 29/7813* (2013.01)

(58) Field of Classification Search
CPC .. H01L 29/404; H01L 29/407; H01L 29/7813
USPC ........................................................ 257/330
See application file for complete search history.

(56) References Cited

U.S. PATENT DOCUMENTS

| 9,716,152 | B2 | 7/2017 | Nagata et al. |
| 2005/0167742 | A1* | 8/2005 | Challa ................. H01L 29/0696 257/E29.264 |
| 2011/0133272 | A1 | 6/2011 | Mauder et al. |

(Continued)

FOREIGN PATENT DOCUMENTS

| JP | 2006-173357 A | 6/2006 |
| JP | 2007-529115 A | 10/2007 |

(Continued)

*Primary Examiner* — Mohammad M Hoque
(74) *Attorney, Agent, or Firm* — Finnegan, Henderson, Farabow, Garrett & Dunner, LLP (57) ABSTRACT

According to one embodiment, a semiconductor device includes first to third electrodes, first and second conductive members, a semiconductor member, and a first insulating member. The first conductive member is electrically connected with the second electrode or is electrically connectable with the second electrode. The semiconductor member includes first to third semiconductor regions. The first semiconductor region includes first to fourth partial regions. The third partial region is between the first and second partial regions. The second semiconductor region is between the third partial region and the third semiconductor region. The fourth partial region is between the third partial region and the second semiconductor region. At least a portion of the second semiconductor region is between the second conductive member and the third electrode. The second conductive member is electrically insulated from the second and third electrodes. The first insulating member includes first to third insulating regions.

19 Claims, 3 Drawing Sheets

(56) References Cited

U.S. PATENT DOCUMENTS

2016/0163804 A1* 6/2016 Kocon ................ H01L 29/7832
  257/329
2016/0329423 A1* 11/2016 Kawahara ......... H01L 21/28114
2019/0259873 A1* 8/2019 Yamanobe ........ H01L 29/41741

FOREIGN PATENT DOCUMENTS

| JP | 2013-214551 A | 10/2013 |
| JP | 2014-78741 A | 5/2014 |
| JP | 2017-45776 A | 3/2017 |
| JP | 2019-145701 A | 8/2019 |
| WO | WO 2005/065385 A2 | 7/2005 |

* cited by examiner

SEMICONDUCTOR DEVICE HAVING MULTIPLE CONDUCTIVE MEMBERS

CROSS-REFERENCE TO RELATED APPLICATIONS

This application is based upon and claims the benefit of priority from Japanese Patent Application No. 2021-006875, filed on Jan. 20, 2021; the entire contents of which are incorporated herein by reference.

FIELD

Embodiments described herein relate generally to a semiconductor device.

BACKGROUND

For example, it is desirable to improve the characteristics of a semiconductor device such as a transistor or the like.

DETAILED DESCRIPTION

According to one embodiment, a semiconductor device includes a first electrode, a second electrode, a third electrode, a first conductive member, a second conductive member, a semiconductor member, and a first insulating member. A direction from the first electrode toward the second electrode is along a first direction. The first conductive member is electrically connected with the second electrode or is electrically connectable with the second electrode. The semiconductor member includes a first semiconductor region of a first conductivity type, a second semiconductor region of a second conductivity type, and a third semiconductor region of the first conductivity type. The first semiconductor region includes a first partial region, a second partial region, a third partial region, and a fourth partial region. A direction from the first partial region toward the first conductive member is along the first direction. A direction from the second partial region toward the third electrode is along the first direction. The third partial region is between the first partial region and the second partial region in a second direction crossing the first direction. The second semiconductor region is between the third partial region and the third semiconductor region in the first direction. The fourth partial region is between the third partial region and the second semiconductor region in the first direction. A direction from the first conductive member toward at least a portion of the fourth partial region is along the second direction. At least a portion of the second semiconductor region is between the second conductive member and the third electrode in the second direction. The second conductive member is electrically insulated from the second and third electrodes. The first insulating member includes a first insulating region, a second insulating region, and a third insulating region. At least a portion of the first insulating region is between the third electrode and the semiconductor member. At least a portion of the second insulating region is between the first conductive member and the semiconductor member. At least a portion of the third insulating region is between the second conductive member and the semiconductor member.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
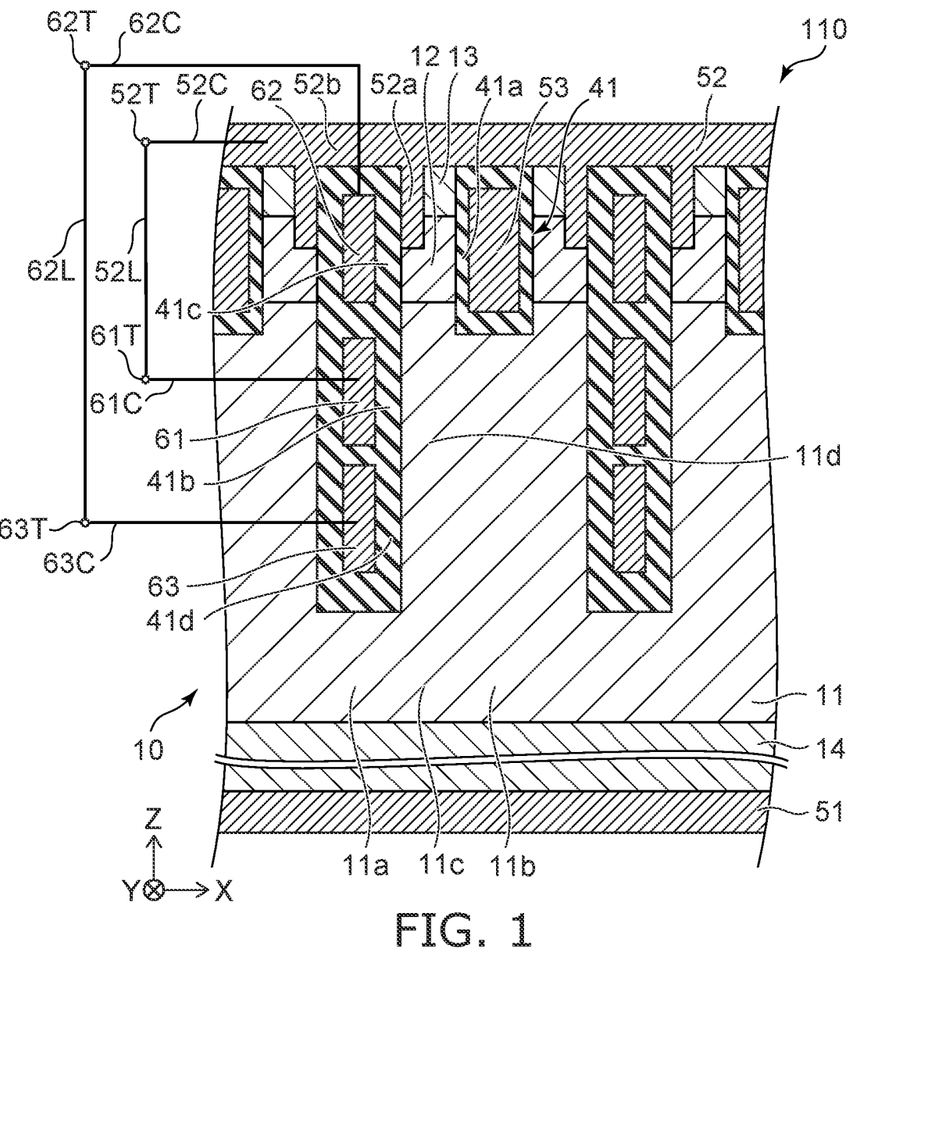
FIG. 1 is a schematic cross-sectional view illustrating a semiconductor device according to a first embodiment.
Figure 2:
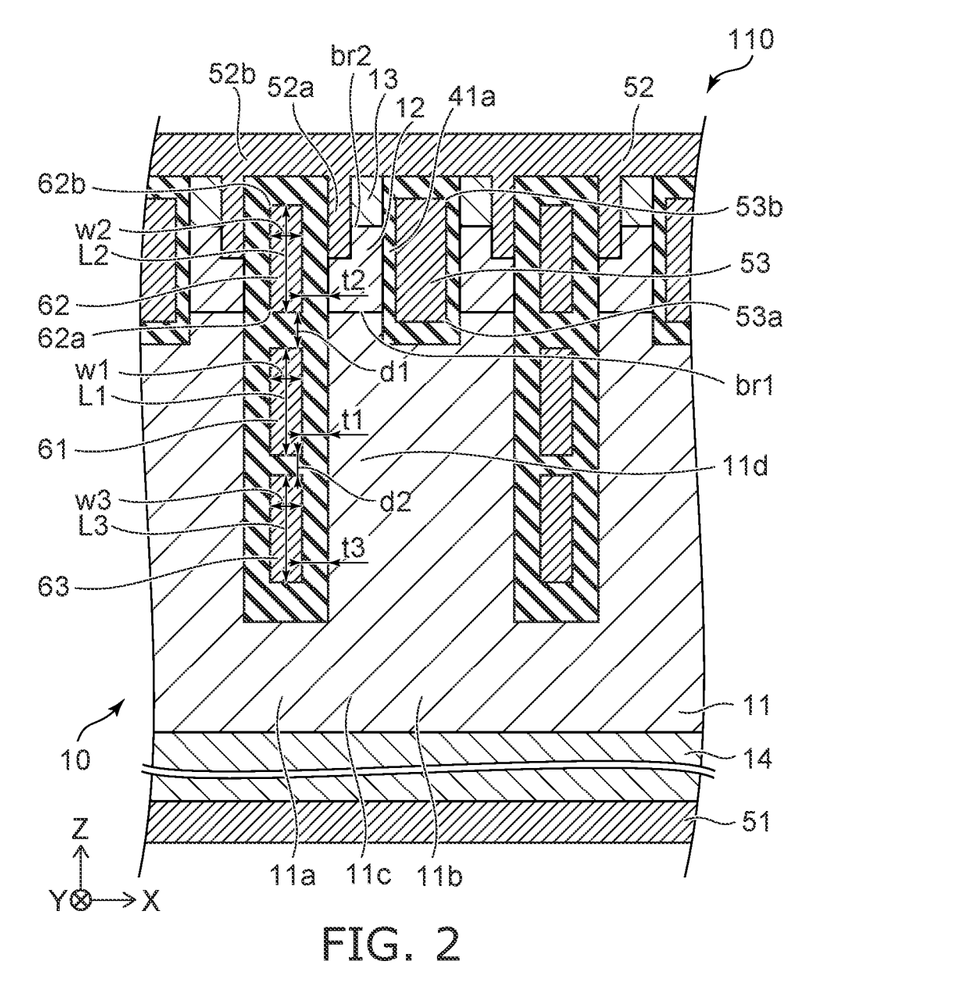
FIG. 2 is a schematic cross-sectional view illustrating the semiconductor device according to the first embodiment.

FIGS. 1 and 2 are schematic cross-sectional views illustrating a semiconductor device according to a first embodiment.

As shown in FIG. 1, the semiconductor device 110 according to the embodiment includes a first electrode 51, a second electrode 52, a third electrode 53, a first conductive member 61, a second conductive member 62, a semiconductor member 10, and a first insulating member 41. In the example, the semiconductor device 110 further includes a third conductive member 63.

The direction from the first electrode 51 toward the second electrode 52 is along a first direction. The first direction is taken as a Z-axis direction. A direction perpendicular to the Z-axis direction is taken as an X-axis direction. A direction perpendicular to the Z-axis direction and the X-axis direction is taken as a Y-axis direction.

In one example, the position in the first direction (the Z-axis direction) of the third electrode 53 is between the position in the first direction of the first electrode 51 and the position in the first direction of at least a portion of the second electrode 52.

The first conductive member 61 is electrically connected with the second electrode 52. Or, the first conductive member 61 is electrically connectable with the second electrode 52.

For example, as shown in FIG. 1, the first conductive member 61 is electrically connected with the second electrode 52 via a connection member 61C, a connection member 52L, and a connection member 52C. These connection members may be located at a different position from the cross section illustrated in FIG. 1. For example, a terminal 52T may be connected with the second electrode 52 via the connection member 52C. A terminal 61T may be electrically connected with the first conductive member 61 via the connection member 61C. The terminal 61T may be electrically connected with the terminal 52T by the connection member 52L. The connection member 52L may be provided separately from the semiconductor device 110.

For example, the semiconductor member 10 is between the first electrode 51 and the second electrode 52. The semiconductor member 10 includes, for example, a semiconductor such as silicon, etc.

The semiconductor member 10 includes a first semiconductor region 11 of a first conductivity type, a second semiconductor region 12 of the second conductivity type, and a third semiconductor region 13 of the first conductivity type. As shown in FIG. 1, the semiconductor member 10 may further include a fourth semiconductor region 14.

For example, the first conductivity type is an n-type; and the second conductivity type is a p-type. According to the embodiment, the first conductivity type may be the p-type; the second conductivity type may be the n-type. In the following example, the first conductivity type is the n-type; and the second conductivity type is the p-type.

The first semiconductor region 11 includes a first partial region 11a, a second partial region 11b, a third partial region 11c, and a fourth partial region 11d. The direction from the first partial region 11a toward the first conductive member 61 is along the first direction (the Z-axis direction). The direction from the second partial region 11b toward the third electrode 53 is along the first direction. The third partial region 11c is between the first partial region 11a and the second partial region 11b in a second direction crossing the first direction. The second direction is, for example, the X-axis direction.

The second semiconductor region 12 is between the third partial region 11c and the third semiconductor region 13 in the first direction (the Z-axis direction). The fourth partial region 11d is between the third partial region 11c and the second semiconductor region 12 in the first direction. The direction from the first conductive member 61 toward at least a portion of the fourth partial region 11d is along the second direction (e.g., the X-axis direction).

The fourth semiconductor region 14 is located between the first electrode 51 and the first semiconductor region 11 in the first direction (the Z-axis direction). The fourth semiconductor region 14 is of the first conductivity type (e.g., the n-type). The fourth semiconductor region 14 is electrically connected with the first electrode 51. The fourth semiconductor region 14 may include, for example, a semiconductor substrate.

The first-conductivity-type carrier concentration in the fourth semiconductor region 14 is greater than the first-conductivity-type carrier concentration in the first semiconductor region 11. The first semiconductor region 11 is, for example, an $n^-$-region or an $n^-$-region. The fourth semiconductor region 14 is, for example, an $n^+$-region. By providing the fourth semiconductor region 14, the resistance of the electrical connection of the first electrode 51 can be reduced. For example, a low on-resistance is obtained.

The first-conductivity-type carrier concentration in the third semiconductor region 13 is greater than the first-conductivity-type carrier concentration in the first semiconductor region 11. The third semiconductor region 13 is, for example, an $n^+$-region.

At least a portion of the second semiconductor region 12 is between the second conductive member 62 and the third electrode 53 in the second direction (e.g., the X-axis direction). At least a portion of the first conductive member is between the first partial region 11a and the second conductive member 62 in the first direction (the Z-axis direction). The second conductive member 62 is electrically insulated from the second and third electrodes 52 and 53. For example, the second conductive member 62 may be electrically insulated from the first electrode 51.

The first insulating member 41 includes a first insulating region 41a, a second insulating region 41b, and a third insulating region 41c. At least a portion of the first insulating region 41a is between the third electrode 53 and the semiconductor member 10. At least a portion of the second insulating region 41b is between the first conductive member 61 and the semiconductor member 10. At least a portion of the third insulating region 41c is between the second conductive member 62 and the semiconductor member 10.

For example, at least a portion of the first insulating region 41a is between the second semiconductor region 12 and the third electrode 53 in the second direction (the X-axis direction). For example, at least a portion of the first insulating region 41a contacts the second semiconductor region 12 and the third electrode 53.

For example, at least a portion of the second insulating region 41b is between the first conductive member 61 and the fourth partial region 11d in the second direction. At least a portion of the second insulating region 41b contacts the first conductive member 61 and the fourth partial region 11d.

For example, at least a portion of the third insulating region 41c is between the second conductive member 62 and the second semiconductor region 12 in the second direction. At least a portion of the third insulating region 41c contacts the second conductive member 62 and the second semiconductor region 12.

The third conductive member 63 is between the first partial region 11a and the first conductive member 61 in the first direction (the Z-axis direction). The third conductive member 63 is electrically connected with the second conductive member 62. Or, the third conductive member 63 is electrically connectable with the second conductive member 62.

For example, as shown in FIG. 1, the third conductive member 63 is electrically connected with the second conductive member 62 via a connection member 63C, a connection member 62L, and a connection member 62C. These connection members may be located at a different position from the cross section illustrated in FIG. 1. For example, a terminal 62T may be connected with the second conductive member 62 via the connection member 62C. A terminal 63T may be electrically connected with the third conductive member 63 via the connection member 63C. The terminal 63T may be electrically connected with the terminal 62T by the connection member 62L. The connection member 62L may be provided separately from the semiconductor device 110.

The third conductive member 63 is electrically insulated from the second and third electrodes 52 and 53. The third conductive member 63 may be electrically insulated from the first electrode 51.

When the third conductive member 63 is provided, the first insulating member 41 may include a fourth insulating region 41d. At least a portion of the fourth insulating region 41d is between the third conductive member 63 and the semiconductor member 10.

For example, at least a portion of the fourth insulating region 41d is between the third conductive member 63 and the fourth partial region 11d in the second direction. At least a portion of the fourth insulating region 41d contacts the third conductive member 63 and the fourth partial region 11d.

For example, the current that flows between the first electrode 51 and the second electrode 52 can be controlled by the potential of the third electrode 53. For example, the potential of the third electrode 53 is referenced to the potential of the second electrode 52. For example, the first electrode 51 functions as a drain electrode. For example, the second electrode 52 functions as a source electrode. For example, the third electrode 53 functions as a gate electrode. For example, the first insulating region 41a functions as a gate insulating film. For example, the first conductive member 61 functions as a field plate that has the potential of the source electrode. For example, the second conductive member 62 and the third conductive member 63 function as a field plate that has a floating potential. The semiconductor device 110 is, for example, a transistor.

According to the embodiment, the first conductive member 61 is located between the third conductive member 63 and the second conductive member 62. For example, the first conductive member 61 is capacitively coupled with the second conductive member 62. For example, the first conductive member 61 is capacitively coupled with the third conductive member 63. The capacitance of the first conductive member 61 can be large. Thereby, for example, local concentration of the electric field can be suppressed more effectively. According to the embodiment, a high breakdown voltage is easily obtained.

For example, by providing two field plates that have floating potentials, compared to when one floating field plate is provided, for example, the capacitance can be large even when the width (the length along the X-axis direction) of the first conductive member 61 is reduced. The width of the first conductive member 61 for obtaining the necessary capacitance is easily reduced. The width of one operation region (element region) is easily reduced thereby. For example, the current that flows per unit area can be increased. For example, the on-resistance per unit area can be reduced. For example, when multiple operation regions (element regions) are provided, the pitch of the multiple operation regions can be reduced. The on-resistance as a semiconductor device can be reduced thereby. According to the embodiment, a semiconductor device can be provided in which the characteristics can be improved.

According to the embodiment, the second conductive member 62 faces the second semiconductor region 12 via the third insulating region 41c. For example, the depletion layer can be extended to the second semiconductor region 12 side by the field plate effect of the second conductive member 62. Thereby, a high breakdown voltage is easily maintained even when, for example, the width (the length along the X-axis direction) of the fourth partial region 11d is reduced. The width of the fourth partial region 11d can be reduced while obtaining a practical breakdown voltage. The width of one operation region (element region) is easily reduced thereby. Also, a low on-resistance is obtained.

As shown in FIG. 2, the first conductive member 61 has a first length L1 along the first direction (the Z-axis direction), and a first width w1 along the second direction (e.g., the X-axis direction). The first length L1 is greater than the first width w1. For example, the first length L1 is greater than 1 times and not more than 16 times the first width w1. By setting the first width w1 to be small, the width of one operation region (element region) can be reduced, and a low on-resistance is obtained. Even when the first width w1 is small, a practical and large electrical capacitance is obtained due to the electrical capacitance between the first conductive member 61 and the second conductive member 62 and the electrical capacitance between the first conductive member 61 and the third conductive member 63.

The second conductive member 62 has a second length L2 along the first direction (the Z-axis direction) and a second width w2 along the second direction (e.g., the X-axis direction). The second length L2 is greater than the second width w2. For example, the second length L2 is greater than 1 times and not more than 7 times the second width w2. By setting the second width w2 to be small, the width of one operation region (element region) can be reduced, and a low on-resistance is obtained. Even when the second width w2 is small, a practical and large electrical capacitance is obtained due to the electrical capacitance between the first conductive member 61 and the second conductive member 62 and the electrical capacitance between the first conductive member 61 and the third conductive member 63.

The third conductive member 63 has a third length L3 along the first direction (the Z-axis direction) and a third width w3 along the second direction (e.g., the X-axis direction). The third length L3 is greater than the third width w3. For example, the third length L3 is greater than 1 times and not more than 16 times the third width w3. By setting the third width w3 to be small, the width of one operation region (element region) can be reduced, and a low on-resistance is obtained. Even when the third width w3 is small, a practical and large electrical capacitance is obtained due to the electrical capacitance between the first conductive member 61 and the second conductive member 62 and the electrical capacitance between the first conductive member 61 and the third conductive member 63.

As shown in FIG. 2, the distance along the first direction (the Z-axis direction) between the first conductive member 61 and the second conductive member 62 is taken as a first distance d1. The distance along the second direction (e.g., the X-axis direction) between the first conductive member 61 and the fourth partial region 11d is taken as a distance t1. For example, it is favorable for the first distance d1 to be not less than 0.5 times and not more than 2 times the distance t1. Because the first distance d1 is not less than 0.5 times the distance t1, for example, dielectric breakdown of the insulating members does not occur easily. By setting the first distance d1 to be not more than 2 times the distance t1, for example, a low on-resistance is obtained.

It is favorable for the first distance d1 to be, for example, not less than 125 nm. A practical breakdown voltage is easily obtained thereby.

As shown in FIG. 2, the distance along the second direction (e.g., the X-axis direction) between the second conductive member 62 and the second semiconductor region 12 is taken as a distance t2. For example, the first distance d1 may be not less than 0.6 times and not more than 2.4 times the distance t2.

As shown in FIG. 2, the distance along the first direction (the Z-axis direction) between the third conductive member 63 and the first conductive member 61 is taken as a second distance d2. The distance along the second direction (e.g., the X-axis direction) between the third conductive member 63 and the fourth partial region 11d is taken as a distance t3. For example, it is favorable for the second distance d2 to be not less than 0.5 times and not more than 2 times the distance t3. Because the second distance d2 is not less than 0.5 times the distance t3, for example, dielectric breakdown of the insulating members does not occur easily. By setting the second distance d2 to be not more than 2 times the distance t3, for example, a low on-resistance is obtained.

It is favorable for the second distance d2 to be, for example, not less than 125 nm. A practical breakdown voltage is easily obtained thereby. The second distance d2 may be, for example, not less than 0.5 times and not more than 2 times the distance t1.

In the example as shown in FIG. 2, a portion of the third semiconductor region 13 is between a portion of the first conductive member 61 and a portion of the third electrode 53 in the second direction (the X-axis direction).

In the example, the position in the first direction (the Z-axis direction) of a boundary br1 between the fourth partial region 11d and the second semiconductor region 12 is between the position in the first direction of the first conductive member 61 and the position in the first direction of the second conductive member 62. The boundary br1 is, for example, the lower end portion of the second semiconductor region 12.

As shown in FIG. 2, the third electrode 53 includes a third electrode end portion 53a and a third electrode other-end portion 53b. The third electrode end portion 53a is between the second partial region 11b and the third electrode other-end portion 53b in the first direction (the Z-axis direction). The third electrode end portion 53a and the third electrode other-end portion 53b are Z-axis direction end portions. The third electrode end portion 53a is, for example, the lower end portion of the third electrode 53. The third electrode other-end portion 53b is, for example, the upper end portion of the third electrode 53.

For example, the position in the first direction of the boundary br1 between the fourth partial region 11d and the second semiconductor region 12 is between the position in the first direction of the third electrode end portion 53a and the position in the first direction of the third electrode other-end portion 53b.

The boundary between the second semiconductor region 12 and the third semiconductor region 13 is taken as a boundary br2. The boundary br2 is, for example, the upper end portion of the second semiconductor region 12. The position in the first direction (the Z-axis direction) of the boundary br2 is between the position in the first direction of the third electrode end portion 53a and the position in the first direction of the third electrode other-end portion 53b.

As shown in FIG. 2, the second conductive member 62 includes a second conductive member end portion 62a and a second conductive member other-end portion 62b. The second conductive member end portion 62a is between the first conductive member 61 and the second conductive member other-end portion 62b in the first direction (the Z-axis direction). The second conductive member end portion 62a and the second conductive member other-end portion 62b are Z-axis direction end portions. The second conductive member end portion 62a is, for example, the lower end portion of the second conductive member 62. The second conductive member other-end portion 62b is, for example, the upper end portion of the second conductive member 62.

For example, the position in the first direction (the Z-axis direction) of the boundary br2 between the second semiconductor region 12 and the third semiconductor region 13 is between the position in the first direction of the second conductive member end portion 62a and the position in the first direction of the second conductive member other-end portion 62b.

In the example as shown in FIG. 2, the second electrode 52 includes a first electrode region 52a. At least a portion of the first electrode region 52a is between the second semiconductor region 12 and a portion of the second conductive member 62 in the second direction (e.g., the X-axis direction).

As shown in FIG. 2, the second electrode 52 may include a second electrode region 52b and a third electrode region 52c. The second conductive member 62 is between the first conductive member 61 and the second electrode region 52b in the first direction (the Z-axis direction). The third electrode 53 is between the second partial region 11b and the third electrode region 52c in the first direction.

FIGS. 3A to 3D are schematic cross-sectional views illustrating semiconductor devices.

Figure 3A:
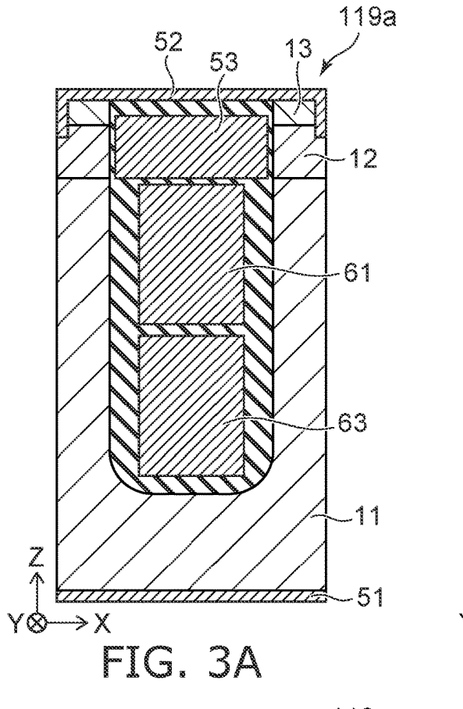
FIGS. 3A to 3D are schematic cross-sectional views illustrating semiconductor devices.
Figure 3B:
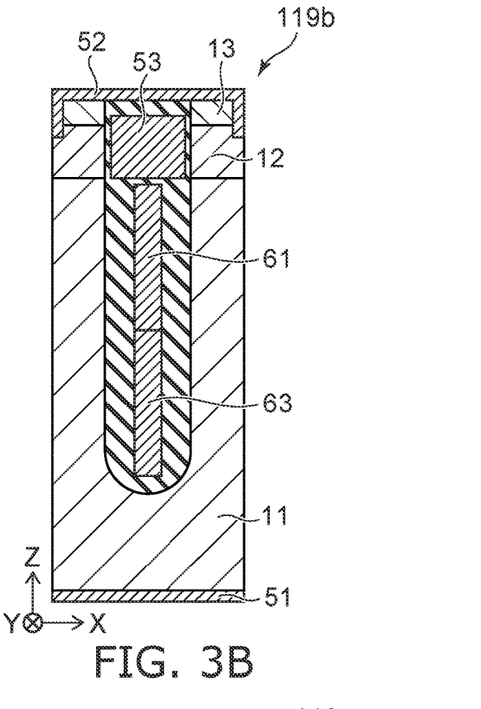
Figure 3C:
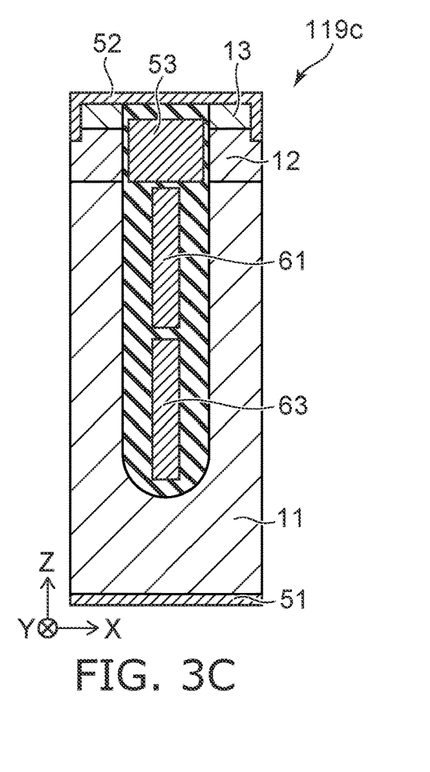
Figure 3D:
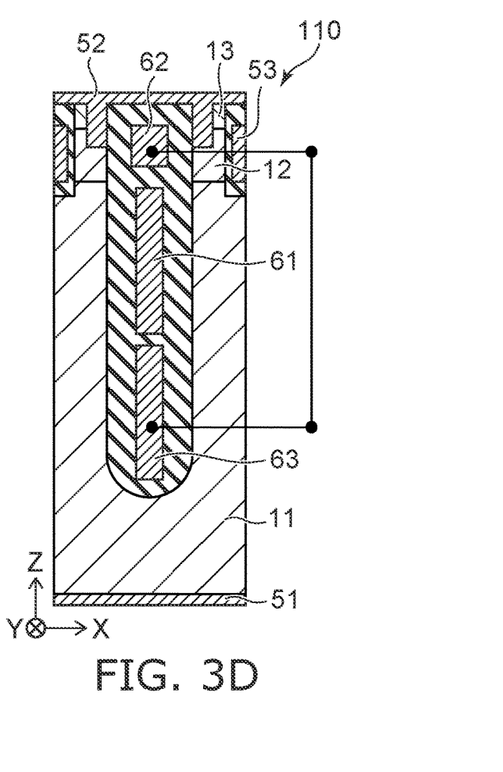

FIGS. 3A to 3C illustrate semiconductor devices 119a to 119c of reference examples. FIG. 3D corresponds to the semiconductor device 110 according to the embodiment.

The second conductive member 62 is not included in the semiconductor devices 119a to 119c. The first conductive member 61 and the third conductive member 63 are included in the semiconductor devices 119a to 119c. The first conductive member 61 is electrically connected to the second electrode 52. The third conductive member 63 has a floating potential.

In the semiconductor device 119a, for example, a high breakdown voltage is obtained by providing the third conductive member 63. In the semiconductor device 119a, the widths of the first and third conductive members 61 and 63 are wide to obtain a sufficient electrical capacitance. Therefore, the width of one operation region (element region) is large. Therefore, the current that flows per unit area is small. As a result, the on-resistance is high.

In the semiconductor device 119b, the widths of the first and third conductive members 61 and 63 are narrow. In the semiconductor device 119b, the distance between the first conductive member 61 and the third conductive member 63 is reduced to obtain a sufficient electrical capacitance for a high breakdown voltage. Therefore, a leakage current easily becomes large at the insulating member between the first conductive member 61 and the third conductive member 63. For example, there are also cases where dielectric breakdown occurs. The semiconductor device 119b is not practical.

In the semiconductor device 119c, the widths of the first and third conductive members 61 and 63 are narrow. In the semiconductor device 119c, the distance between the first conductive member 61 and the third conductive member 63 is increased to suppress the leakage current and dielectric breakdown. Therefore, the electrical capacitance between the first conductive member 61 and the third conductive member 63 is small. In the semiconductor device 119c, it is difficult to obtain a sufficient breakdown voltage.

Conversely, the second conductive member 62 is included in the semiconductor device 110 according to the embodiment. The electrical capacitance between the first conductive member 61 and the second conductive member 62 and the electrical capacitance between the first conductive member 61 and the third conductive member 63 can be utilized. Thereby, a high breakdown voltage can be maintained even when the widths of the conductive members are reduced. The distance between two conductive members may not be excessively short. According to the embodiment, for example, the leakage current and dielectric breakdown can be suppressed. According to the embodiment, it is easy to reduce the width of one operation region (element region). According to the embodiment, for example, a low on-resistance is obtained.

In embodiments described above, it is favorable for the first-conductivity-type carrier concentration in the first semiconductor region 11 to be, for example, not less than $1.0 \times 10^{15}$ cm$^{-3}$ and not more than $1.0 \times 10^{17}$ cm$^{-3}$. It is favorable for the second-conductivity-type carrier concentration in the second semiconductor region 12 to be, for example, not less than $1.0 \times 10^{16}$ cm$^{-3}$ and not more than $1.0 \times 10^{18}$ cm$^{-3}$. It is favorable for the first-conductivity-type carrier concentration in the third semiconductor region 13 to be, for example, not less than $3.0 \times 10^{18}$ cm$^{-3}$ and not more than $3.0 \times 10^{20}$ cm$^{-3}$. It is favorable for the first-conductivity-type carrier concentration in the fourth semiconductor region 14 to be, for example, not less than $1.0 \times 10^{17}$ cm$^{-3}$ and not more than $3.0 \times 10^{20}$ cm$^{-3}$.

In embodiments described above, for example, the first-conductivity-type impurity concentration in the fourth semiconductor region 14 is greater than the first-conductivity-type impurity concentration in the first semiconductor region 11.

It is favorable for the first-conductivity-type impurity concentration in the first semiconductor region 11 to be, for example, not less than $1.0\times10^{15}$ cm$^{-3}$ and not more than $1.0\times10^{17}$ cm$^{-3}$. It is favorable for the second-conductivity-type impurity concentration in the second semiconductor region 12 to be, for example, not less than $1.0\times10^{16}$ cm$^{-3}$ and not more than $1.0\times10^{''}$ cm$^{-3}$. It is favorable for the first-conductivity-type impurity concentration in the third semiconductor region 13 to be, for example, not less than $3.0\times10^{18}$ cm$^{-3}$ and not more than $3.0\times10^{20}$ cm$^{-3}$. It is favorable for the first-conductivity-type impurity concentration in the fourth semiconductor region 14 to be, for example, not less than $1.0\times10^{17}$ cm$^{-3}$ and not more than $3.0\times10^{20}$ cm$^{-3}$.

The semiconductor member includes, for example, silicon. The semiconductor member may include, for example, a compound semiconductor, etc. The first electrode 51 includes, for example, at least one selected from the group consisting of aluminum, titanium, nickel, and gold. The second electrode 52 includes, for example, at least one selected from the group consisting of aluminum, titanium, nickel, and gold. The third electrode 53 and the first to third conductive members 61 to 63 include, for example, conductive silicon or polysilicon. The first insulating member 41 includes, for example, at least one selected from the group consisting of silicon oxide, silicon nitride, and silicon oxynitride.

In embodiments, information that relates to the configurations of the semiconductor regions, etc., is obtained by, for example, electron microscopy, etc. Information that relates to the impurity concentrations of the semiconductor regions is obtained by, for example, EDX (Energy Dispersive X-ray Spectroscopy), SIMS (Secondary Ion Mass Spectrometry), etc. Information that relates to the carrier concentrations of the semiconductor regions is obtained by, for example, SCM (Scanning Capacitance Microscopy), etc.

According to embodiments, a semiconductor device can be provided in which characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor members, semiconductor regions, conductive members, electrodes, insulating members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward the second electrode being along a first direction;
a third electrode;
a first conductive member, the first conductive member being electrically connected with the second electrode;
a semiconductor member, the semiconductor member including a first semiconductor region of a first conductivity type, a second semiconductor region of a second conductivity type, and a third semiconductor region of the first conductivity type, the first semiconductor region including a first partial region, a second partial region, a third partial region, and a fourth partial region, a direction from the first partial region toward the first conductive member being along the first direction, a direction from the second partial region toward the third electrode being along the first direction, the third partial region being between the first partial region and the second partial region in a second direction crossing the first direction, the second semiconductor region being between the third partial region and the third semiconductor region in the first direction, the fourth partial region being between the third partial region and the second semiconductor region in the first direction, a direction from the first conductive member toward at least a portion of the fourth partial region being along the second direction, the second direction being along a face of the first electrode opposing the first semiconductor region;
a second conductive member, at least a portion of the second semiconductor region being between the second conductive member and the third electrode in the second direction, the second conductive member being electrically insulated from the second and third electrodes, the first conductive member being between the first electrode and the second conductive member in the first direction, a direction from the second conductive member toward the second semiconductor region being along the second direction, and a position in the first direction of a boundary between the fourth partial region and the second semiconductor region is between a position in the first direction of the first conductive member and a position in the first direction of the second conductive member; and
a first insulating member, the first insulating member including a first insulating region, a second insulating region, and a third insulating region, at least a portion of the first insulating region being between the third electrode and the semiconductor member, at least a portion of the second insulating region being between the first conductive member and the semiconductor member, at least a portion of the third insulating region being between the second conductive member and the semiconductor member, the first insulating member including a portion provided between the first conductive member and the second conductive member in the first direction, the portion directly contacting the first conductive member and the second conductive member;

wherein the portion is bounded in the second direction by a dimension in the second direction of the first conducting member or the second conducting member.

2. The device according to claim 1, wherein the second conductive member is electrically insulated from the first electrode.

3. The device according to claim 1, wherein
the at least a portion of the first insulating region contacts the second semiconductor region and the third electrode,
the at least a portion of the second insulating region contacts the first conductive member and the fourth partial region, and
the at least a portion of the third insulating region contacts the second conductive member and the second semiconductor region.

4. The device according to claim 1, further comprising:
a third conductive member,
the third conductive member being between the first partial region and the first conductive member in the first direction,
the third conductive member being electrically connected with the second conductive member,
the third conductive member being electrically insulated from the second and third electrodes,
the first insulating member including a fourth insulating region,
at least a portion of the fourth insulating region being between the third conductive member and the semiconductor member.

5. The device according to claim 4, wherein
the third conductive member has a third length along the first direction, and a third width along the second direction, and
the third length is greater than the third width.

6. The device according to claim 4, wherein
the third length is greater than 1 times and not more than 16 times the third width.

7. The device according to claim 4, wherein
a second distance along the first direction between the third conductive member and the first conductive member is not less than 0.5 times and not more than 2 times a distance along the second direction between the third conductive member and the fourth partial region.

8. The device according to claim 4, wherein
a second distance along the first direction between the third conductive member and the first conductive member is not less than 125 nm.

9. The device according to claim 1, wherein
the first conductive member has a first length along the first direction, and a first width along the second direction, and
the first length is greater than the first width.

10. The device according to claim 9, wherein
the first length is greater than 1 times and not more than 16 times the first width.

11. The device according to claim 1, wherein
the second conductive member has a second length along the first direction, and a second width along the second direction, and
the second length is greater than the second width.

12. The device according to claim 11, wherein
the second length is greater than 1 times and not more than 7 times the second width.

13. The device according to claim 1, wherein
a first distance along the first direction between the first conductive member and the second conductive member is not less than 0.6 times and not more than 2.4 times a distance along the second direction between the first conductive member and the fourth partial region.

14. The device according to claim 1, wherein
a first distance along the first direction between the first conductive member and the second conductive member is not less than 125 nm and not more than 2 times a distance along the second direction between the first conductive member and the fourth partial region.

15. The device according to claim 1, wherein
a portion of the third semiconductor region is between a portion of the first conductive member and a portion of the third electrode in the second direction.

16. The device according to claim 1, wherein
the third electrode includes a third electrode end portion and a third electrode other-end portion,
the third electrode end portion is between the second partial region and the third electrode other-end portion in the first direction, and
a position in the first direction of a boundary between the fourth partial region and the second semiconductor region is between a position in the first direction of the third electrode end portion and a position in the first direction of the third electrode other-end portion.

17. The device according to claim 1, wherein
the third electrode includes a third electrode end portion and a third electrode other-end portion,
the third electrode end portion is between the second partial region and the third electrode other-end portion in the first direction, and
a position in the first direction of a boundary between the second semiconductor region and the third semiconductor region is between a position in the first direction of the third electrode end portion and a position in the first direction of the third electrode other-end portion.

18. The device according to claim 1, wherein
the second conductive member includes a second conductive member end portion and a second conductive member other-end portion,
the second conductive member end portion is between the first conductive member and the second conductive member other-end portion in the first direction, and
a position in the first direction of a boundary between the second semiconductor region and the third semiconductor region is between a position in the first direction of the second conductive member end portion and a position in the first direction of the second conductive member other-end portion.

19. The device according to claim 1, wherein
the second electrode includes a first electrode region, and
at least a portion of the first electrode region is between the second semiconductor region and a portion of the second conductive member in the second direction.

* * * * *